United States Patent [19]

Leuschner

[11] 3,971,060

[45] July 20, 1976

[54] TTL COUPLING TRANSISTOR

[75] Inventor: Horst Leuschner, Dallas, Tex.

[73] Assignee: Texas Instruments Incorporated, Dallas, Tex.

[22] Filed: July 12, 1974

[21] Appl. No.: 486,706

[52] U.S. Cl. ............................... 357/51; 307/213; 307/215; 307/303; 357/36; 357/48; 357/86

[51] Int. Cl.² .................... H01L 27/04; H01L 29/08

[58] Field of Search .............. 357/48, 86, 36, 51; 307/213, 215, 303

[56] References Cited
UNITED STATES PATENTS

| | | | |
|---|---|---|---|
| 3,629,609 | 12/1971 | Pedersen et al. | 307/215 |
| 3,676,713 | 7/1972 | Wiedmann | 357/48 |
| 3,702,955 | 11/1972 | Kalb et al. | 357/48 |

OTHER PUBLICATIONS

Berger et al, "Superintegrated Voltage Clamp", IEEE Journal of Solid–State Circuits, vol. SC-8, No. 3, June 1973, p. 231.

*Primary Examiner*—William D. Larkins
*Attorney, Agent, or Firm*—Harold Levine; James T. Comfort; James O. Dixon

[57] ABSTRACT

An improved TTL coupling transistor structure wherein a pair of lateral extensions of the base region and overlying opposite type conductivity low resistivity regions provide a pair of resistance-distributed diode elements interconnecting the base and collector regions and acting to control undesirable currents in the device.

1 Claim, 4 Drawing Figures

TTL COUPLING TRANSISTOR

One of the most widely used semiconductor circuits today is the transistor coupled logic circuit, also called TTL or T²L. The circuit was originally conceived in the early days of integrated circuits but was often embodied using discrete transistors. However, it proved to be most useful in integrated logic circuits.

As shown in FIG. 1, the basic circuit comprises a number of input transistors 1, 1' and 1'', a coupling transistor 12 having one or more emitters 2, 2' and 2'', a base 3 connected by a resistor 4 to $V_{CC}$ voltage and a collector 5 and an output transistor 6. The collector of each input transistor is tied to an emitter of the coupling transistor and to $V_{CC}$ voltage through resistors 7, 7' and 7''. The collector of the coupling transistor is connected to the base of the output transistor 6, the collector of which is tied to $V_{CC}$ voltage through bias resistor 8. The emitters of the input and output transistors are connected to circuit ground.

In operation of the NPN version of the circuit shown in FIG. 1, when the bases of all of the input transistors are at low logic level or near circuit ground all of the input transistors are turned off and therefore their collectors and the emitters of the coupling transistor 12 to which they are connected are at approximately $V_{CC}$ voltage. Under these conditions the collector-base junction of coupling transistor 12 is forward biased as is the base-emitter junction of output transistor 6. Transistor 6 is thus turned on by current flowing through resistor 4, base 3, collector 5 and base-emitter of transistor 6. When any one or more of the bases of the input transistors is raised to a high logic level, the base emitter junction of that transistor is forward biased and the transistor turns on causing its collector and the emitter of the coupling transistor to which it is connected to be just slightly above ground potential. This produces a forward bias across the grounded emitter-base junction of the coupling transistor 12 to the extent that base current of this transistor now flows in the grounded emitter circuit. Under these conditions the potential above ground of the base of the coupling transistor becomes equal to the saturation voltage of the input transistor plus the forward base-emitter drop ($V_{be}$) of the coupling transistor. This potential is less than the $2V_{be}$, the sum of the voltage drops of the forward biased base-collector junction of transistor 12 and base-emitter junction of transistor 6, and thus is too low to produce current flow across these junctions. Denied of base drive current transistor 6 then turns off and its output terminal rises to a high logic level. The theory of operation of TTL circuits is more fully explained in U.S. Pat. No. 3,283,170 issued Nov. 1, 1966 to James L. Buie and entitled "Coupling Transistor Logic and Other Circuits."

Circuits of the type shown in FIG. 1 are used extensively today in integrated circuits as NAND or NOR gates. However, in modern high speed, low power integrated circuits requiring a very high density of components and low current drain, certain formerly minor problems have become more pronounced and serious. For example, the emitters of a multiple emitter coupling transistor in modern integrated circuits need to be placed extremely close together, so close in fact that transistor action can take place between a "grounded" emitter and any nearby emitter at a high logic level, i.e., near $V_{CC}$ which will act as a collector. Under such conditions undesirable currents may flow in the spurious transistor thus formed increasing power supply and heat dissipation requirements for the integrated circuit. In FIG. 1 this spurious transistor action is symbolized by transistor 11 shown in dashed lines. Also, a spurious transistor action will often take place because of the structure of modern integrated circuits which allows the substrate of semiconductor material to act as an element of a complementary transistor. This spurious transistor action "siphons" current from the collector of the coupling transistor and thus severely limits the drive current available into the output transistor or transistors as will be explained more fully later. Transistor 13 shown in dashed lines in FIG. 1 represents the spurious substrate transistor.

According to the present invention a resistor-distributed diode structure is built into the coupling transistor to provide a current shunting action which limits current through the base region of the coupling transistor. Since it is this base emitter current which acts as the base drive current for the spurious transistor formed by the collector action of adjacent positively biased emitters, a reduction of this drive current approximately proportionately reduces the collector current drawn by such spurious transistors. Also by the present invention another resistor-distributed diode structure is built into the coupling transistor to provide a current shunting action around the base-collector junction of the coupling transistor such that current is not drawn from the coupling transistor collector region to act as the base drive current of the spurious substrate transistor at the expense of output drive current from the coupling transistor. These two resistor-distributed diode structures are incorporated into the integrated circuit coupling transistor cell with only a very minor increased space requirement for the cell since they are formed by only a very slight extension of the diffused base region of prior art devices and an additional diffused region thereover which is produced simultaneously with the emitter diffusion.

It is one object then of the present invention to provide the structure for an improved coupling transistor suitable for use in the TTL integrated circuit devices.

It is a further object of the present invention to provide an improved TTL coupling transistor device providing a larger available output drive current without increasing power consumption.

It is a still further object of the present invention to provide an improved TTL coupling transistor device having decreased leakage currents and low standby power consumption.

It is a still further object of the present invention to provide a TTL integrated circuit device wherein spurious transistor currents associated with the coupling transistors are lowered without the use of gold doping which adversely affects the performance of other transistors of the integrated circuit device.

These and other objects and advantages of the present invention will become more fully apparent from the following detailed description and the accompanying drawings in which.

Figure 1:
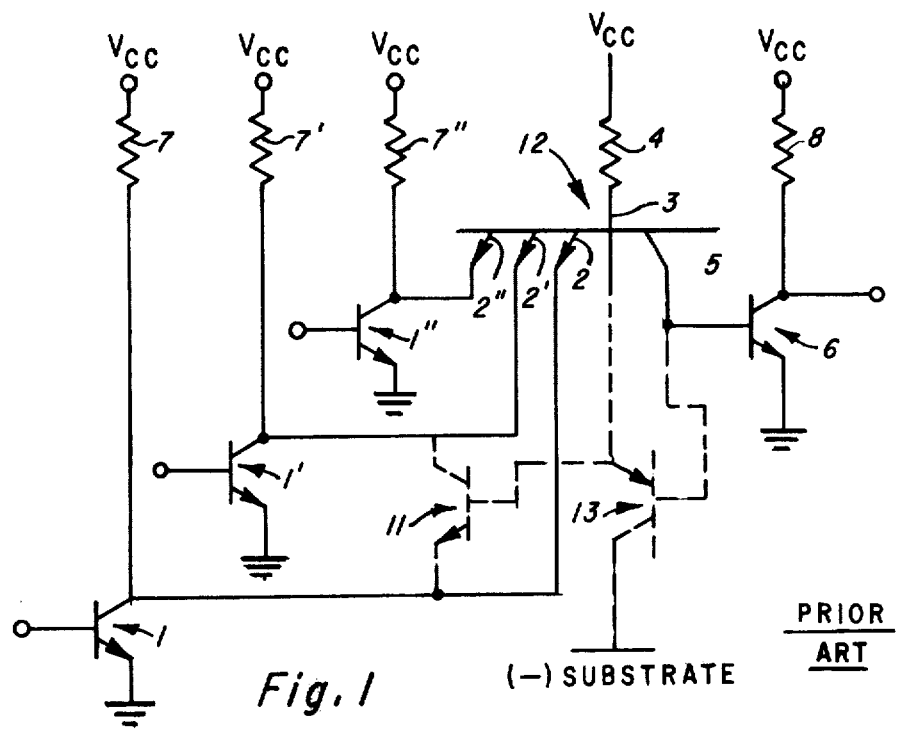
FIG. 1 is a schematic diagram illustrating a TTL circuit of the prior art.

Turning now to FIG. 1 already discussed briefly, multiple emitter coupling transistors for TTL circuits in the prior art tend to cause useless and excessive current flow when one of the input transistors 1 is conducting, i.e., biased "on" while another of the input transistors 1' is nonconductive, i.e., biased "off." Under these conditions the collector of the conducting transistor 1 and the emitter 2' of the coupling transistor to which it is connected are both very near ground potential. At the same time the collector of input transistor 1' and the emitter 2' of the coupling transistor to which it is connected are near the $V_{CC}$ voltage supply through the input load resistor 7'.

Current then flows through resistor 4, the base 3, emitter 2 of the coupling transistor 12 and the collector-emitter circuit of transistor 1 to ground. If the emitters of the coupling transistor 12 are close enough together, the other ungrounded emitters biased at near $V_{CC}$ will act as collectors and will draw currents of magnitudes proportional to the $H_{FE}$ of the transistor 11 thus formed times the base-emitter current. In the prior art, gold doping in the base layer was sometimes used to lower the $H_{FE}$ of this spurious transistor and thus lower the current drawn by emitter 2' acting as a collector. Such a solution had the disadvantage of lowering the $H_{FE}$ of the rest of the bipolar devices of the integrated circuit as well.

When in prior art TTL integrated circuits all the emitters of coupling transistor 12 were at a positive potential and current was flowing in resistor 4 through the base-collector circuit of transistor 12 and the base-emitter circuit of output transistor 6, some of the current from the collector 5 of the coupling transistor was shunted to the substrate by its spurious complementary transistor 13. This transistor was formed by the base 3 of the coupling transistor 12 acting as emitter, the collector 5 of the coupling transistor acting as the base and the opposite type conductivity substrate beneath the collector 5 acting as a collector. Such shunting action could prevent the output transistor 6 or any other transistors driven in parallel with it from turning on completely or reliably because of lack of base drive current. Thus the "fan-out" or number of output transistors which could be driven in parallel from one coupling transistor was limited. This limited "fan-out" in turn limited the complexity of circuits suitable for integration.

Figure 2:
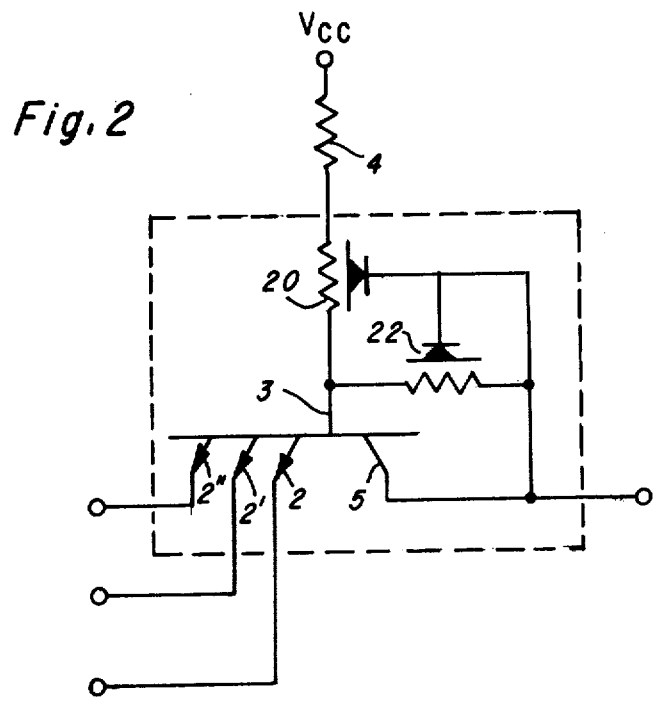
FIG. 2 is a schematic diagram illustrating the circuit of a TTL coupling transistor of the present invention.

The circuit schematically diagrammed in FIG. 2 illustrates solutions to these problems according to the present invention. The circuit of FIG. 2 shows the coupling transistor of FIG. 1 with the addition of two resistor-distributed diode elements 20 and 22.

The resistor portion of element 20 is inserted between the base contact and the base region 3 of coupling transistor 12 with the diode portion connected between the resistor portion and the collector contact of transistor 12. The resistor portion of element 22 is connected between the base region 3 and the collector contact of transistor 12 with the diode portion between the resistor portion and the collector contact of transistor 12.

In this arrangement when one of the emitters 2 of transistor 12 is at low potential, the diode portion of the element 20 is forward biased and its diode drop plus the saturation resistance of the transistor 12 is such that most of the current of emitter 2 is through the collector to the emitter 2 of transistor 12 and thus the base-emitter current available to produce transistor action with emitter 2' for example, still at high potential, it is considerably lowered. Such an arrangement can lower the base-emitter current by a factor of from 10 to 20 with a corresponding lowering of the base drive current to the spurious transistor 11 formed by the collector action of emitter 2'.

The action of element 20 is self-regulating to the base-emitter current of transistor 3 just at saturation level. Should this current tend to increase above saturation, the voltage drop across the resistance portion of element 20 tends to increase thus increasing the forward biased area of the distributed diode portion shunting more current to the collector thus reducing the base-emitter current.

When all of the emitters of transistor 12 are at high potential the base current shifts to the collector 5 of the coupling transistor. Under these conditions the diode of element 20 is forward biased and provides drive current to the base of the output to transistor 6 around the base 3 collector 5 circuit. Also, the element 22 shunts the emitter-base circuit of substrate transistor 13 effectively lowering absorption by the substrate of any substantial amount of drive current from collector 5.

Figure 3:
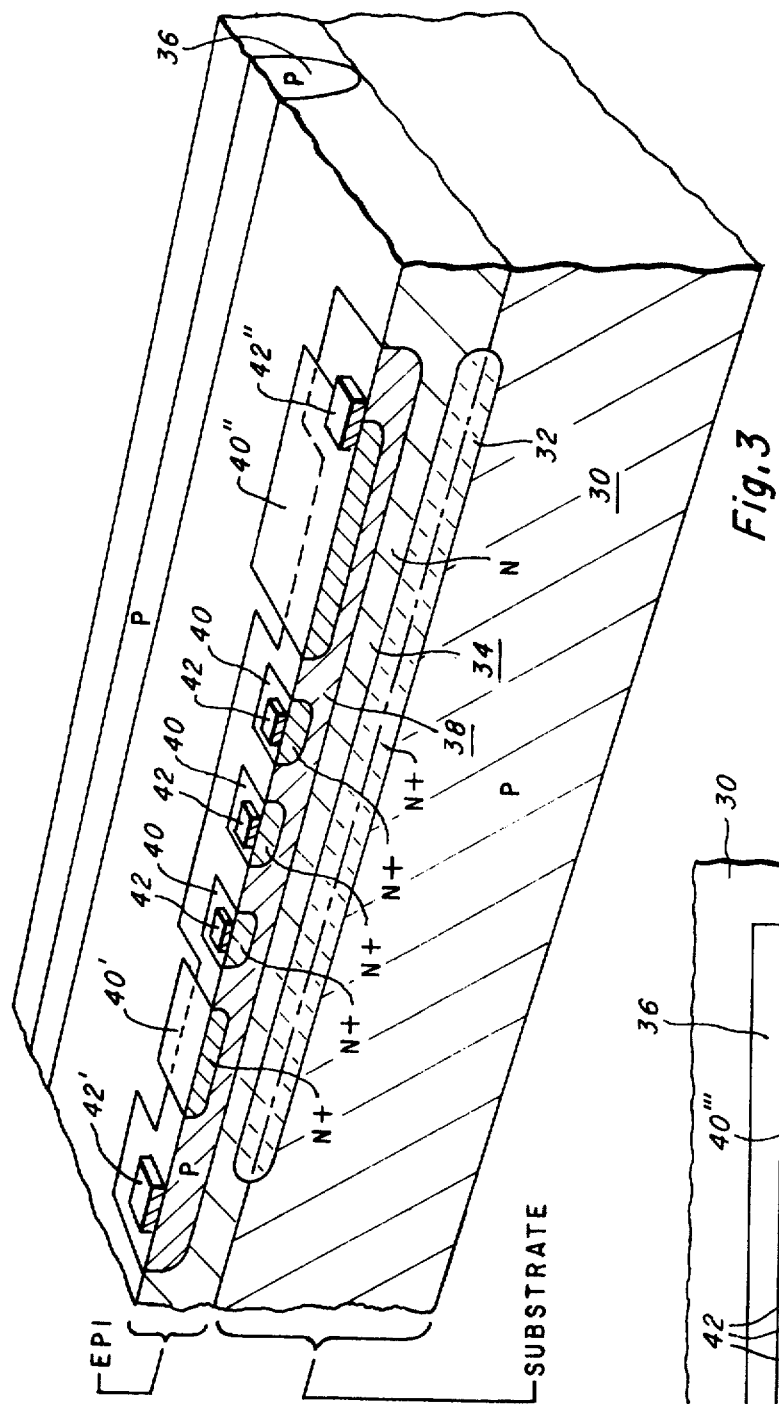
FIG. 3 is a perspective view, partially in section, illustrating the structure of the device of the present invention as embodied in the structure of an integrated circuit semiconductor chip.

Shown in FIG. 3 is an integrated circuit embodiment of the present invention which has been found to perform well. FIG. 3 is a perspective view, partially in section, of a small region of an integrated circuit chip which contains the coupling transistor of the present invention.

The integrated circuit chip with circuit components therein may be formed as follows. A single crystal slice 30 of P-type conductivity semiconductor material such as silicon has diffused therein N-type conductivity producing impurities in desired regions to form an N+ layer 32 extending into the substrate a short distance. Thereafter, an N-type layer 34 of semiconductor material is epitaxially grown on the one surface of the substrate. This grown layer will also be of single crystal material and will contain an extension of the N+ region 32 diffused therein by the heat of the epitaxial growth process from the region originally produced in substrate 30. Next, patterned regions of P-type conductivity producing impurities are diffused through a mask to form P-type isolation boundaries 36 enclosing small areas in which the circuit components are to be formed. This diffusion is carried out for a time sufficient to allow the P-type region 36 to reach the substrate P-type material. Subsequently, another pattern mask is applied to the slice and P-type impurities are diffused into the exposed portions of the slice to form region 38 which will be the base region of the transistor and the resistor elements of the finished device as well as the anodes of the diode. Again, the slice is remasked and N+ regions 40, 40' and 40'' are diffused into the slice. Further masking and metal evaporation steps produce contacts 42, 42' and 42''. Insulated conductive metallic interconnections are then formed between the various elements to complete the integrated circuits. Finally, this slice is divided into individual integrated circuit chips, each containing a complete circuit. The integrated circuit chips are then placed in housings and the required connections are made to the housing terminals to complete the integrated circuit devices. Details of these processes are so well-known to those skilled in the art that no further discussion is deemed necessary. Further, there exist many other well-known processes by which integrated circuits with the transistor element of the present invention may be formed and for this reason the above-described process has been given only by way of illustrative example.

In FIG. 3, only a portion of a "cell" of an integrated circuit containing the transistor of the present invention is shown. Also, the usual oxide insulating coating and the interconnection metallization of the integrated circuit have been omitted for clarity.

Correlating the elements of the structure of FIG. 3 now with the schematic diagram of FIG. 2, the N+ regions of 40 constitute the emitters 2, 2' and 2'' in FIG. 2; that portion of the P region 38 underlying the emitters constitutes the base region 3 and the N region 34 immediately beneath the base constitutes the collector region 5. That portion of the P region 38 extending from the base region to the base contact 42' and underlying the N+ region 40' constitutes the base resistor portion of element 20 and the anode of the diode element while the N+ region 40' constitutes the cathode of the diode portion of element 20. The extension of the N+ region 40' beyond the P region 38 into the surface area of the N region 34 is the connection to the collector region of the diode cathode. The portion of the P region 38 extending from the base region to the collector contact 42' and underlying N+ region 40'' constitutes the resistor portion of element 22 as well as the diode anode; the N+ region 40'' forms the cathode of the diode and, because this region extends into the N region 34, it also provides connection between the diode cathode, the collector contact 42'', the collector region of the coupling transistor and the extension of base region 38 which forms the resistance portion of element 22. The N+ region 32, because of its low resistivity, functions in a manner well-known in the prior art to hold all of the overlying collector region 34, as well as N+ regions 40' and 40'' and contact 42'' at essentially the same potential, i.e., the collector terminal potential.

It should be noted that the two resistor-distributed diode elements are interactive in their operation as shown but they are not interdependent in their action. Thus, either of these elements may be used in the structure without the other and still provide a coupling transistor device having many of the advantages noted previously.

The structure of the coupling transistor of the present invention requires very little more space in an integrated circuit chip than prior art coupling transistors. For example, coupling transistors according to the present invention designed to operate at 5 volts $V_{cc}$ and with a resistance in element 20 of approximately 20,000 ohms and a resistance in element 22 of 50,000 ohms requires a space between 0.002 inches and 0.004 inches wide by from 0.010 inches to 0.020 inches long depending on the number of emitters required for the transistor and the resistor layout configuration, whether straight line or "zig-zag."

Although the resistance values given above have been found quite satisfactory, the magnitude of resistance required is not at all critical but optimum values are dependent on the many different factors of the circuit environment in which the device is to be used. Once knowing the structure and application, however, any skilled circuit designer can pick optimum resistance values with only slight experimentation.

Figure 4:
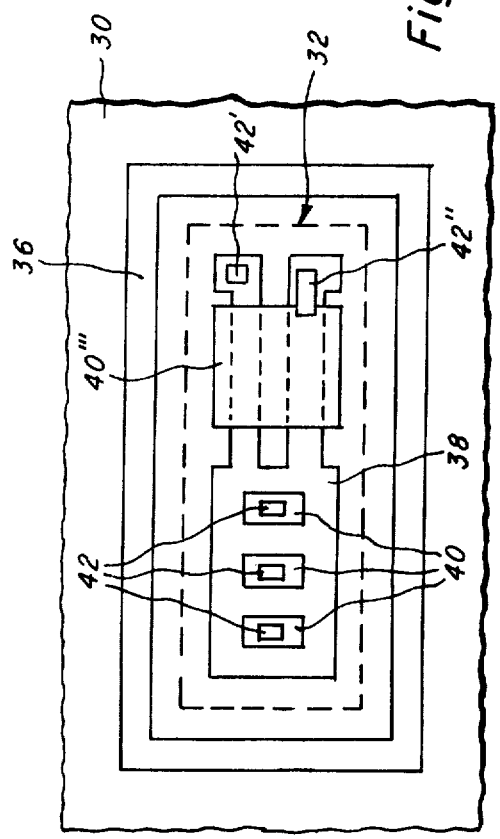
FIG. 4 is a top view illustrating an alternate embodiment of the device of the present invention.

The present invention has been illustrated and described herein using an NPN structure by way of example. The principles of the invention, of course, may be equally applied to PNP structures. Further, the region 38 extensions need not extend in opposite directions from the active base area but may extend at any convenient angle to each other. They may even be two separate parallel extensions in the same direction in which event the two N+ regions 40' and 40'' may be combined into a single region 40''' in contact with both extensions as shown in FIG. 4.

Other changes and modifications still within the scope and spirit of the present invention will, of course, occur to those skilled in the art and it is therefore intended that this invention be limited only as specifically set forth in the following claims.

What is claimed is:

1. A transistor device comprising:
   a. a single crystal body of semiconductor materials;
   b. a first region of one conductivity type adjacent one surface of said body and of a resistivity suitable to act as the collector of the transistor;
   c. a second region of the opposite type conductivity adjacent said one surface of said body entirely within and surrounded by said first region and of a resistivity suitable to act as the base of the transistor;
   d. a plurality of third regions of said one type conductivity adjacent said one surface, each entirely within and surrounded by said second region;
   e. a pair of elongated extensions of said second regions extending in substantially the same direction from said second region and terminating in areas remote from said third regions;
   f. a fourth region of said one type conductivity adjacent said one surface having a resistivity approximately that of said third regions and contacting a length of each of said elongated extensions and said first region;
   g. an ohmic base contact to one of said elongated extensions near the area of its termination; and
   h. a collector contact making ohmic connection to both said fourth region and the other of said elongated extensions near the area of termination of said other elongated extension.

* * * * *